US012426418B2

(12) United States Patent
Zhao et al.

(10) Patent No.: US 12,426,418 B2
(45) Date of Patent: Sep. 23, 2025

(54) MANUFACTURING METHOD OF ARRAY SUBSTRATE, ARRAY SUBSTRATE, AND DISPLAY PANEL

(71) Applicant: TCL CHINA STAR OPTOELECTRONICS TECHNOLOGY CO., LTD., Shenzhen (CN)

(72) Inventors: Bin Zhao, Shenzhen (CN); Juncheng Xiao, Shenzhen (CN); Xiaodan Lin, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/772,772

(22) PCT Filed: Apr. 22, 2022

(86) PCT No.: PCT/CN2022/088497
§ 371 (c)(1),
(2) Date: Apr. 28, 2022

(87) PCT Pub. No.: WO2023/193310
PCT Pub. Date: Oct. 12, 2023

(65) Prior Publication Data
US 2024/0162400 A1 May 16, 2024

(30) Foreign Application Priority Data
Apr. 8, 2022 (CN) .......................... 202210367147.9

(51) Int. Cl.
*H01L 33/62* (2010.01)
*H01L 25/075* (2006.01)
(Continued)

(52) U.S. Cl.
CPC ....... *H10H 20/857* (2025.01); *H01L 25/0753* (2013.01); *H01L 25/167* (2013.01);
(Continued)

(58) Field of Classification Search
None
See application file for complete search history.

(56) References Cited

U.S. PATENT DOCUMENTS

2009/0277672 A1 11/2009 Matsumoto
2022/0350199 A1* 11/2022 Sang ................ G02F 1/133603

FOREIGN PATENT DOCUMENTS

CN 104617042 A 5/2015
CN 105723817 A 6/2016
(Continued)

OTHER PUBLICATIONS

PCT International Search Report for International Application No. PCT/CN2022/088497, mailed on Dec. 15, 2022, 8pp.
(Continued)

*Primary Examiner* — William C Trapanese
(74) *Attorney, Agent, or Firm* — The Roy Gross Law Firm, LLC; Roy D. Gross

(57) ABSTRACT

The present application provides a manufacturing method of an array substrate, an array substrate, and a display panel. The manufacturing method of the array substrate includes providing a base substrate; forming a conductive layer and a photoresist layer on the base substrate; patterning the photoresist layer and the conductive layer to form a conductive area and an electroplating area electrically connected to each other; removing the photoresist layer; forming an electroplating layer; and disconnecting the electroplating area from the conductive area. In the present application, the photoresist layer has a less thickness to reduce manufacturing costs of the array substrate.

20 Claims, 5 Drawing Sheets

(51) Int. Cl.
*H01L 25/16* (2023.01)
*H10D 86/40* (2025.01)
*H10D 86/60* (2025.01)
*H10H 20/857* (2025.01)
*H10H 20/01* (2025.01)

(52) U.S. Cl.
CPC ........... *H10D 86/443* (2025.01); *H10D 86/60* (2025.01); *H10H 20/032* (2025.01); *H10H 20/0364* (2025.01)

(56) References Cited

FOREIGN PATENT DOCUMENTS

| | | |
|---|---|---|
| CN | 108091776 A | 5/2018 |
| CN | 108172584 A | 6/2018 |
| CN | 113809095 A | 12/2021 |
| WO | 2021134794 A1 | 7/2021 |

OTHER PUBLICATIONS

PCT Written Opinion of the International Searching Authority for International Application No. PCT/CN2022/088497, mailed on Dec. 15, 2022, 9pp.

Chinese Office Action issued in corresponding Chinese Patent Application No. 202210367147.9 dated Dec. 31, 2024, pp. 1-6, 13pp.

* cited by examiner

MANUFACTURING METHOD OF ARRAY SUBSTRATE, ARRAY SUBSTRATE, AND DISPLAY PANEL

CROSS REFERENCE TO RELATED APPLICATIONS

This application is a National Phase of PCT Patent Application No. PCT/CN2022/088497 having International filing date of Apr. 22, 2022, which claims the benefit of priority of Chinese Patent Application No. 202210367147.9, filed Apr. 8, 2022, the contents of which are all incorporated herein by reference in their entirety.

FIELD OF DISCLOSURE

The present application relates to a field of display technology and in particular, to a manufacturing method of an array substrate, an array substrate, and a display panel.

DESCRIPTION OF RELATED ART

With the development of display technology, mini-LED and micro-LED are getting more and more popular. A higher current is required to drive mini-LEDs and micro-LEDs, which leads to an increase in a thickness of a metal film layer of an array substrate. At present, electroplating is often used to produce thicker metal film layers, but in manufacturing methods of conventional array substrates, a thicker photoresist layer is often required to meet requirements for manufacturing thick metal film layers. As a result, manufacturing costs and energy consumption of the array substrate are relatively high.

SUMMARY

The present application provides a manufacturing method of an array substrate, an array substrate, and a display panel, which can solve the problems of high manufacturing costs and high energy consumption in a manufacturing process of conventional array substrates.

The present application provides a manufacturing method of an array substrate, wherein the manufacturing method includes following steps:
  providing a base substrate;
  sequentially forming a conductive layer and a photoresist layer on the base substrate;
  patterning the photoresist layer and the conductive layer, wherein the patterned conductive layer includes a conductive area and an electroplating area which are electrically connected;
  removing the photoresist layer;
  forming an electroplating layer on the conductive layer at a position corresponding to the electroplating area; and
  disconnecting the electroplating area from the conductive area.

Optionally, in some embodiments of the present application, the step of patterning the photoresist layer and the conductive layer includes:
  patterning the photoresist layer to expose a portion of the conductive layer;
  patterning the conductive layer and removing the exposed portion of the conductive layer to form a conductive electrode, a plurality of connection portions, a plurality of trace portions, and a plurality of seed portions, wherein the conductive electrode and the connection portions form a conductive area, the trace portions and the seed portions form an electroplating area, each trace portion is electrically connected to the seed portions, and the connection portions are connected between the conductive electrode and the trace portions, so that the electroplating area and the conductive area are electrically connected to each other.

Optionally, in some embodiments of the present application, the conductive layer includes multiple trace portions and multiple connection portions, and the connection portions and the trace portions are connected in a one-to-one correspondence.

Optionally, in some embodiments of the present application, the conductive electrode is strip-shaped, the trace portions are arranged side by side along an extending direction of the conductive electrode, and each connection portion is connected between the conductive electrode and one of the trace portions.

Optionally, in some embodiments of the present application, along the extending direction of the conductive electrode, a width of each connection portion is less than a width of the correspondingly connected trace portion.

Optionally, in some embodiments of the present application, the step of forming the electroplating layer on the conductive layer at a position corresponding to the electroplating area includes:
  providing an electrolytic cell, wherein the electrolytic cell includes an anode, a cathode, and an electrolyte electrically connected between the anode and the cathode;
  placing the trace portions and the seed portions in the electrolyte of the electrolytic cell;
  electrically connecting the conductive electrode to the cathode of the electrolytic cell; and
  applying a preset current between the anode and the cathode of the electrolytic cell, so that the electroplating layer is formed on the trace portions and the seed portions.

Optionally, in some embodiments of the present application, the step of disconnecting the electroplating area from the conductive area includes:
  removing and cutting off the connection portions, so that the conductive electrode is disconnected from the trace portions, and the electroplating area is disconnected from the conductive area.

Optionally, in some embodiments of the present application, the manufacturing method further includes following steps:
  patterning the trace portions and the electroplating layer on the trace portions to form a plurality of conductive lines, so that the conductive lines are electrically connected to the seed portions.

Optionally, in some embodiments of the present application, a thickness of the photoresist layer is greater than or equal to 1 micrometer and less than or equal to 1.5 micrometers.

The present application further provides an array substrate, including:
  a base substrate;
  a conductive layer disposed on the base substrate, wherein the conductive layer includes a conductive area and an electroplating area both in a patterned form, and the conductive area and the electroplating area are spaced apart; and
  an electroplating layer disposed on the conductive layer at a position corresponding to the electroplating area.

Optionally, in some embodiments of the present application, the conductive area includes a conductive electrode, the electroplating area includes a plurality of trace portions and a plurality of seed portions, the trace portions are electrically connected to the seed portions, and the electroplating layer is disposed on the trace portions and the seed portions.

Optionally, in some embodiments of the present application, the electroplating area includes multiple trace portions and multiple seed portions, and each of the trace portions is electrically connected to the seed portions.

Optionally, in some embodiments of the present application, the seed portions and the electroplating layer on the seed portions form one or more of a gate, a gate line, a source-drain, or a data line.

Optionally, in some embodiments of the present application, the trace portions and the electroplating layer on the trace portions constitute a plurality of conductive lines, and the conductive lines are electrically connected to the seed portions.

Optionally, in some embodiments of the present application, the seed portions are distributed in an array, and each of the conductive lines is electrically connected to each column of the seed portions.

Optionally, in some embodiments of the present application, the conductive electrode is strip-shaped, and the trace portions are arranged side by side along an extending direction of the conductive electrode.

Optionally, in some embodiments of the present application, the conductive electrode is disposed at an edge of the base substrate, and the trace portions are arranged side by side on a same side of the conductive electrode.

Optionally, in some embodiments of the present application, a thickness of the conductive layer is greater than or equal to 0.5 micrometer and less than or equal to 0.6 micrometer; and a thickness of the electroplating layer is greater than or equal to 6 micrometers.

Optionally, in some embodiments of the present application, a material of the conductive layer is same as a material of the electroplating layer.

The present application further provides a display panel, including:
  the array substrate mentioned above;
  a light-emitting device disposed on the array substrate;
  an encapsulating assembly disposed on the light-emitting device.

Advantages of the Present Application

The manufacturing method of the array substrate of the present application includes providing a base substrate; sequentially forming a conductive layer and a photoresist layer on the base substrate; patterning the photoresist layer and the conductive layer, wherein after patterned, the conductive layer includes the electroplating area and the conductive area which are electrically connected; removing the photoresist layer; forming an electroplating layer on the conductive layer at a position corresponding to the electroplating area; and disconnecting the electroplating layer from the conductive layer. The photoresist layer on the conductive layer is removed before the step of forming the electroplating layer, so the photoresist layer is only used for patterning the conductive layer. As a result, the photoresist layer has a thinner thickness and requires less material, thus reducing production costs and energy consumption for producing the array substrate.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DESCRIPTION OF REFERENCE NUMBERS

Figure 1:
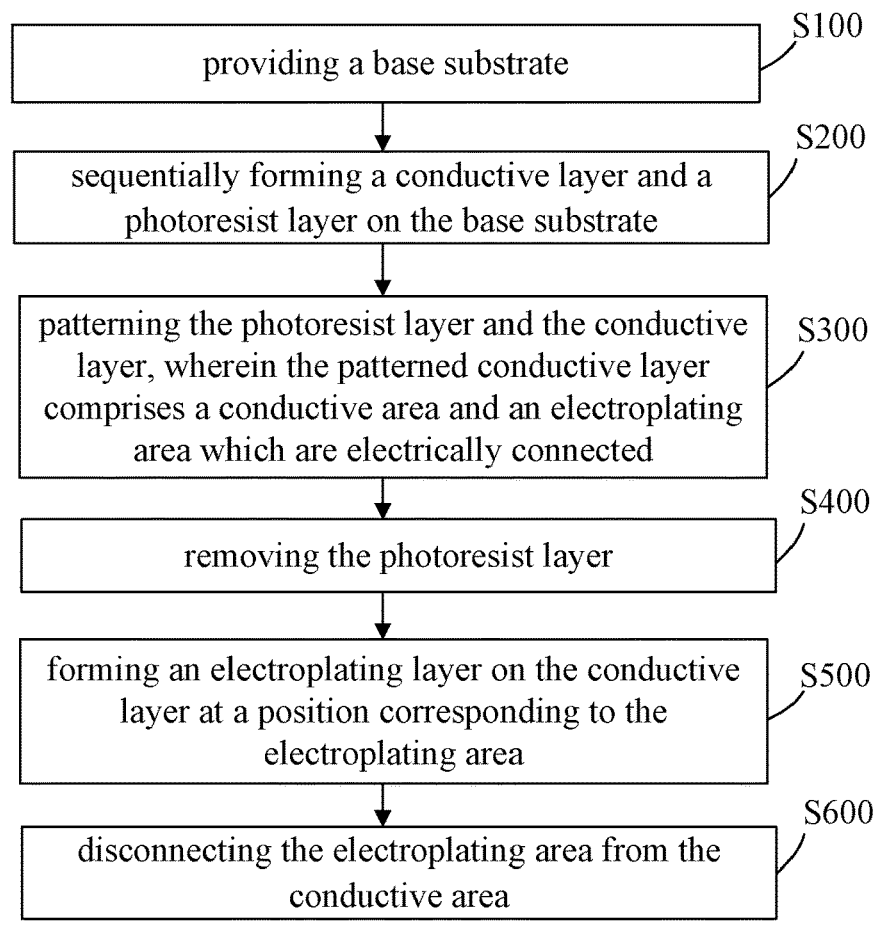
FIG. 1 is a process flow diagram illustrating a manufacturing method of an array substrate according to one embodiment of the present application.

| reference number | Part Name | reference number | Part Name |
| --- | --- | --- | --- |
| 10 | display panel | 1221 | trace portion |
| 100 | array substrate | 1222 | conductive line |
| 110 | base substrate | 1223 | seed portion |
| 120 | conductive layer | 130 | electroplating layer |
| 121 | conductive area | 200 | photoresist layer |
| 1211 | conductive electrode | 300 | light-emitting device |
| 1212 | connection portion | 400 | encapsulating assembly |
| 122 | electroplating area | | |

DETAILED DESCRIPTION OF EMBODIMENTS

The present application is clearly and completely described below with reference to the drawings in the embodiments of the present application. Obviously, the described embodiments are only some of the embodiments of the present application, rather than all the embodiments. Based on the embodiments in the present application, all other embodiments obtained by those skilled in the art without creative efforts shall fall within the protection scope of the present application. In addition, it should be understood that the specific embodiments described herein are only used to illustrate and explain the present application, but not to limit the present application. In the present application, unless otherwise specified, directional terms such as "upper" and "lower" generally refer to upper and lower directions of the device in actual use or working state, specifically the directions in the drawings while "inner" and "outer" are referred to with respect to an outline of the device.

The present application provides a manufacturing method of an array substrate, an array substrate, and a display panel.

Embodiments will be described in detail below. It should be noted that a description order of the following embodiments is not intended to limit a preferable order of the embodiments.

Figure 9:
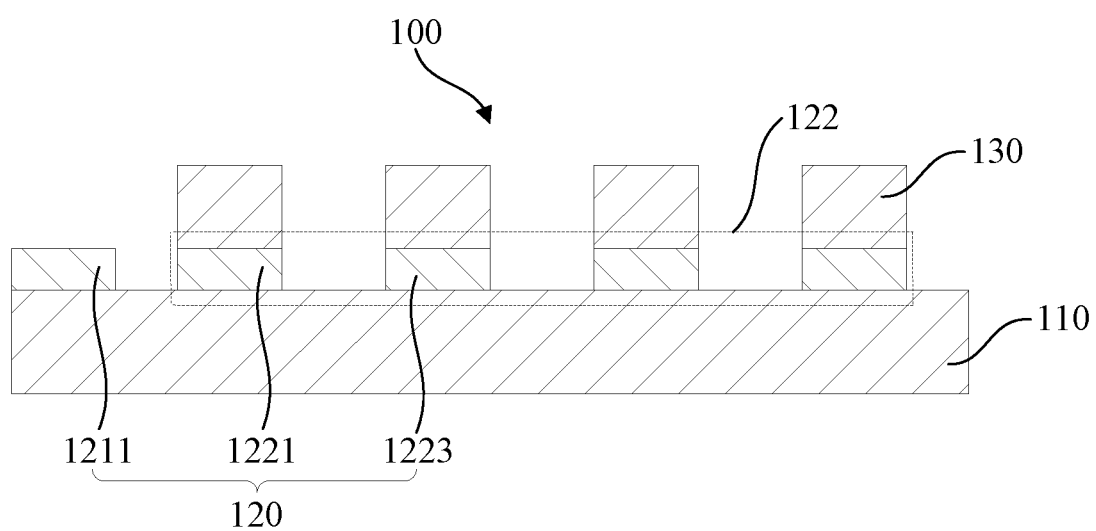
FIG. 9 is a schematic structural view illustrating an array substrate according to one embodiment of the present application.

First, the present application provides a manufacturing method of an array substrate. As shown in FIG. 1 and FIG. 9, the manufacturing method of the array substrate mainly includes following steps:

S100: providing a base substrate 110. The base substrate 110 is used as a support structure for the array substrate 100 to support other functional film layers in the array substrate 100 to ensure the overall structural stability of the array substrate 100. A material of the base substrate 110 can be a glass substrate or other types of materials, as long as the base substrate 110 provides sufficient support strength.

Before producing other films on the base substrate 110, the base substrate 110 needs to be cleaned first to ensure that a surface of the base substrate 110 is free from contaminants such as oil stains and to avoid affecting connection strength between a subsequent film layer and the base substrate 110, thereby ensuring the structural stability between the film layer and the base substrate 110 of the array substrate 100.

S200: sequentially forming a conductive layer 120 and a photoresist layer 200 on the base substrate 110.

Figure 3:
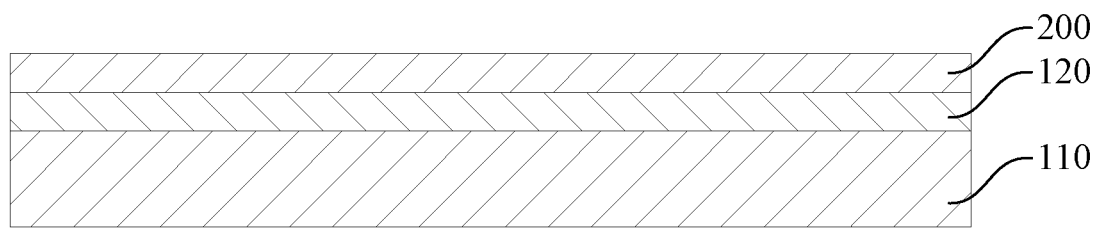
FIG. 3 is a schematic structural view of step S200 in FIG. 1 according to one embodiment of the present application.

As shown in FIG. 3, after the base substrate 110 is treated, the conductive layer 120 is first deposited on the base substrate 110. The conductive layer 120 is used as a seed layer of a metal film layer in the array substrate 100 and used to cause electrical conduction of circuits in a subsequent manufacturing process. A material of the conductive layer 120 can be a metal material such as copper, aluminum, titanium, or molybdenum, so as to ensure that the conductive layer 120 has good conductivity. In the present application, the material of the conductive layer 120 is copper with low resistivity, so as to reduce overall internal resistance of the array substrate 100 and prevent a voltage drop caused by the internal resistance of the conductive layer 120 from affecting operations of the array substrate 100.

After the conductive layer 120 is produced, a photoresist layer 200 is formed on the conductive layer 120. A material of the photoresist layer 200 includes positive photoresists or negative photoresists. Depending on a type of the photoresists, different exposure methods are used, resulting in different target patterns.

S300: patterning the photoresist layer 200 and the conductive layer 120, wherein the patterned conductive layer 120 includes a conductive area 121 and an electroplating area 122 that are electrically connected to each other.

Figure 4:
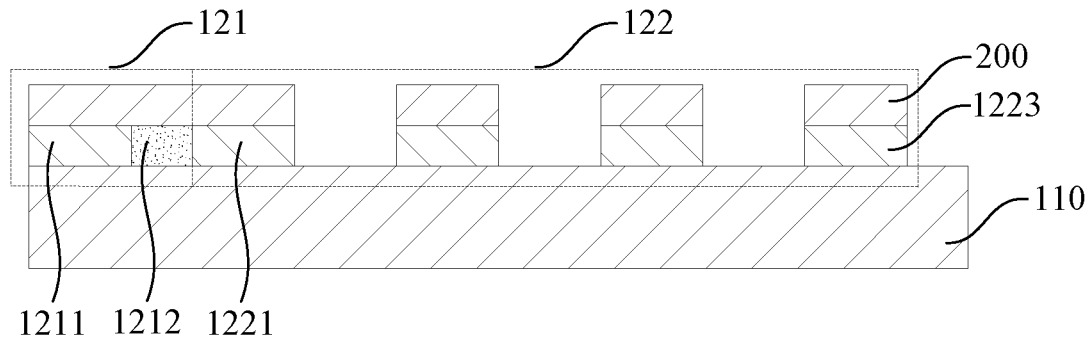
FIG. 4 is a schematic structural view of step S300 in FIG. 1 according to one embodiment of the present application.

As shown in FIG. 4, when the conductive layer 120 and the photoresist layer 200 are formed on the base substrate 110, entire surfaces of the conductive layer 120 and the photoresist layer 200 are fabricated. According to requirements for a structural design of the array substrate 100, the conductive layer 120 needs to be patterned to form different conductive structures. When to pattern the conductive layer 120, the photoresist layer 200 can be used as a mask (reticle) structure of the conductive layer 120. That is to say, a target pattern of the conductive layer 120 can be formed according to a pattern of the photoresist layer 200, such that the conductive area 121 and the electroplating area 122 electrically connected to each other are formed on the base substrate 110.

The conductive area 121 mainly functions to conduct electricity, so that the electroplating area 122 is connected to external circuits. The electroplating area 122 functions to form an electroplating structure so as to form a target film layer. Furthermore, the electroplating area 122 is electrically connected to the conductive area 121. That is to say, the conductive layer 120 after patterned still keeps electrical connection of an entire circuit, so as to facilitate subsequent processes.

Figure 2:
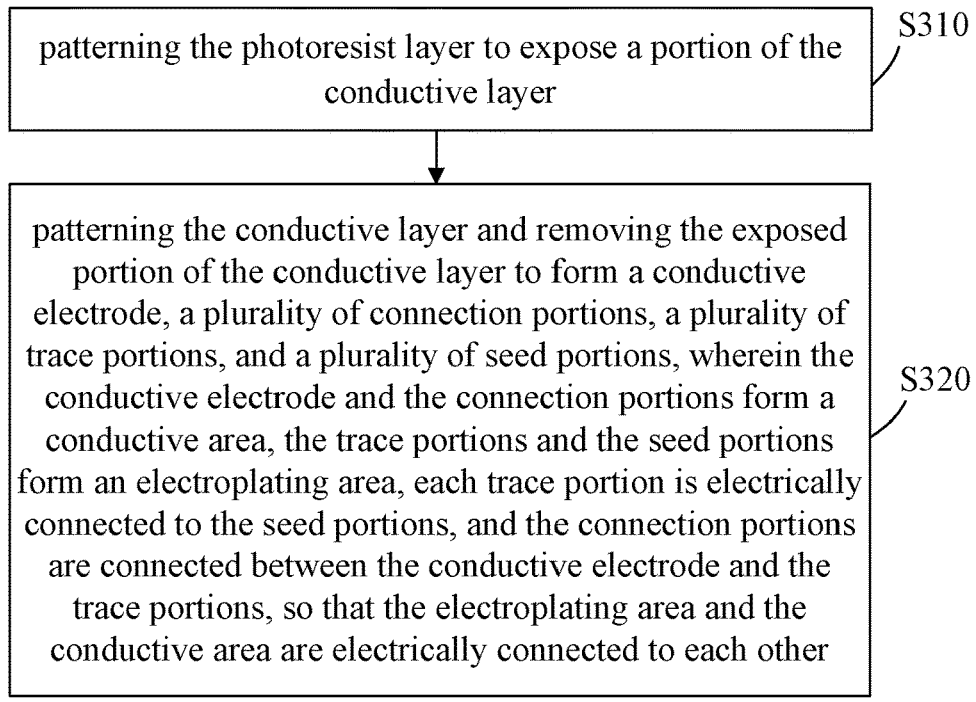
FIG. 2 is a process flow diagram illustrating step S300 in FIG. 1 according to one embodiment of the present application.

Optionally, as shown in FIG. 2, step S300 of the present application mainly includes following steps:

S310: patterning the photoresist layer 200 to expose a portion of the conductive layer 120.

After the conductive layer 120 and the photoresist layer 200 are sequentially formed on the base substrate 110, the photoresist layer 200 needs to be patterned according to the design requirements of the array substrate 100 to form a target pattern. The patterned photoresist layer 200 can be used as a mask.

When the photoresist layer 200 is positive photoresists, a portion of the photoresist layer 200 exposed to light dissolves in a photoresist developer, while a portion of the photoresist layer 200 not exposed to light does not dissolve in the photoresist developer. That is to say, the portion of the photoresist layer 200 not exposed to light remains and forms the target pattern. When the photoresist layer 200 is negative photoresists, the portion of the photoresist layer 200 exposed to light does not dissolve in the photoresist developer, while the portion of the photoresist layer 200 not exposed to light dissolves in the photoresist developer. That is to say, the portion of the photoresist layer 200 exposed to light remains and forms the target pattern.

S320: patterning the conductive layer 120 and removing the exposed portion of the conductive layer 120 to form a conductive electrode 1211, a plurality of connection portions 1212, a plurality of trace portions 1221, and a plurality of seed portions 1223, wherein the conductive electrode 1211 and the connection portions 1212 form the conductive area 121, the trace portions 1221 and the seed portions 1223 form the electroplating area 122, the trace portions 1221 are electrically connected to the seed portions 1223, and the connection portions 1212 are connected between the conductive electrode 1211 and the trace portions 1221, so that the electroplating area 122 and the conductive area 121 are electrically connected to each other.

After the photoresist layer 200 is patterned, a portion of the conductive layer 120 is exposed, and then the patterned photoresist layer 200 is used as the mask to pattern the conductive layer 120 to remove the exposed portion of the conductive layer 120 to obtain the target pattern of the conductive layer 120. That is to say, after patterned, the patterns of the conductive layer 120 and the photoresist layer 200 are the same. By adjusting the ways of patterning the photoresist layer 200 according to the design requirements of the conductive layer 120, different structures of the conductive layer 120 can be obtained.

After patterning the conductive layer 120, the conductive layer 120 is divided into the conductive area 121 and the electroplating area 122. The conductive area 121 includes the conductive electrode 1211 and the plurality of connection portions 1212, and the electroplating area 122 includes the plurality of trace portions 1221 and the plurality of seed portions 1223. The trace portions 1221 are electrically connected to the seed portions 1223 to realize electrical connection inside the electroplating area 122, and the connection portions 1212 are connected between the conductive electrode 1211 and the trace portions 1221, so as to realize electrical connection between the conductive area 121 and the electroplating area 122. In addition, the conductive electrode 1211 is used for connecting to the external circuits, and the connection portions 1212 are used as conductive channels for electrical connecting the electroplating area 122 to the external circuits, so as to facilitate a subsequent electroplating process.

It should be noted that the conductive electrode 1211 is connected to the trace portions 1221 through the connection portions 1212, so that under the condition that a structure and a position of the conductive electrode 1211 remain unchanged, positions of the connection portion 1212 can be adjusted according to the specific structure of the trace portions 1221 and the seed portions 1223 in the electroplating area 122, so that the electrical connection between the conductive electrode 1211 and the trace portions 1221 is made in a more flexible manner, which facilitates an overall structural layout design of the conductive layer 120.

Figure 6:
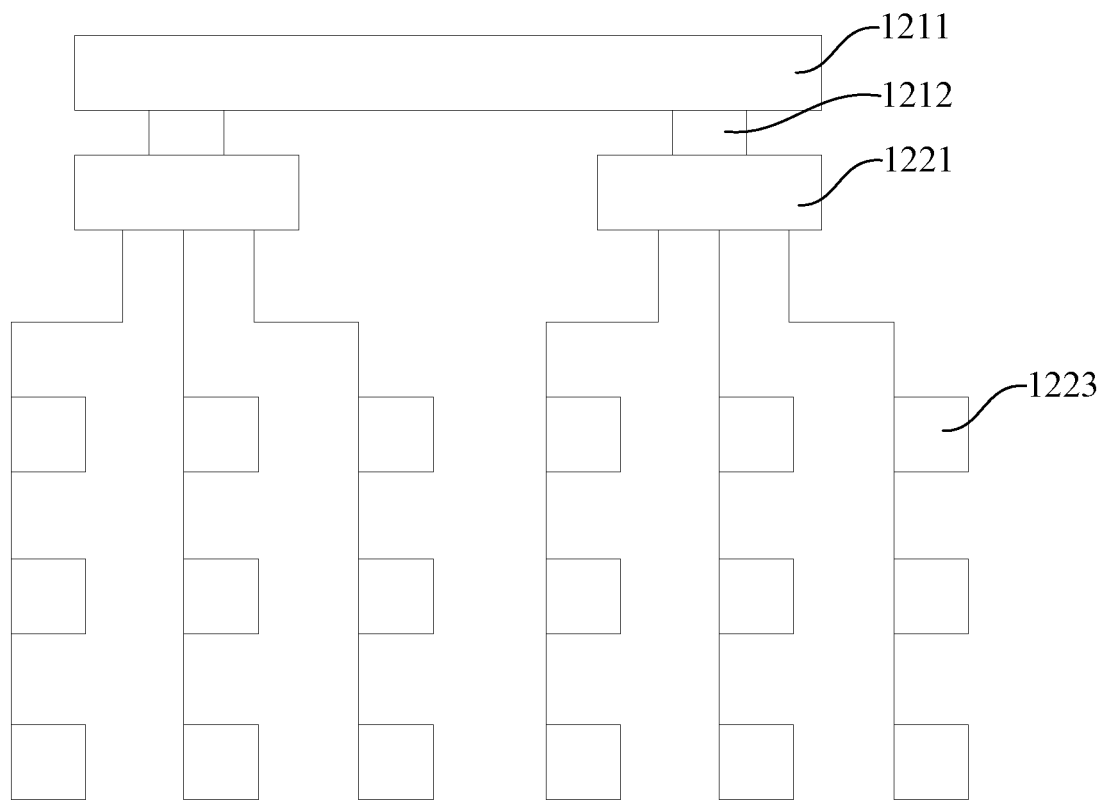
FIG. 6 is a top view illustrating step S400 in FIG. 1 according to one embodiment of the present application.

In some embodiments, as shown in FIG. 6, when the conductive layer 120 is patterned, the seed portions 1223 can be formed, and the trace portions 1221 are electrically connected to the seed portions 1223 at the same time. By electrically connecting one trace portion 1221 to the seed portions 1223, and then electrically connecting the trace portion 1221 to the conductive electrode 1211 through the connection portion 1212, the present application ensures that the conductive electrode 1211 is electrically connected to the plurality of seed portions 1223 at the same time, which simplifies the connection between the conductive electrode 1211 and the seed portions 1223.

In other embodiments, the conductive layer 120 includes multiple trace portions 1221, and each trace portion 1221 is electrically connected to multiple seed portions 1223. Meanwhile, the conductive layer 120 includes multiple connection portions 1212, and the connection portions 1212 are connected to the trace portions 1221 in one-to-one correspondence, so as to realize the electrical connection between the conductive electrode 1211 and the trace portions 1221. Through the configuration and distribution manner of the trace portions 1221, different structural design requirements of the conductive layer 120 can be met, thereby expanding an application range of the array substrate 100.

As shown in FIG. 6, the conductive electrodes 1211 are strip-shaped, multiple trace portions 1221 are arranged side by side along an extending direction of the conductive electrodes 1211. Each connection portion 1212 is connected between the conductive electrode 1211 and one of the trace portions 1221. This kind of structural design is conducive to arranging the multiple seed portions 1223 in parallel lines, so as to avoid mutual crosstalk and prevent the subsequent electroplating process from being affected.

It should be noted that, along the extending direction of the conductive electrode 1211, a width of the connection portion 1212 is less than a width of the correspondingly connected trace portion 1221, so that the connection portion 1212 and the trace portion 1221 can be directly distinguished in appearance and shape. Also, such a design helps to disconnect the conductive electrode 1211 from the trace portion 1221 by processing the connection portion 1212 later.

S400: removing the photoresist layer 200.

Figure 5:
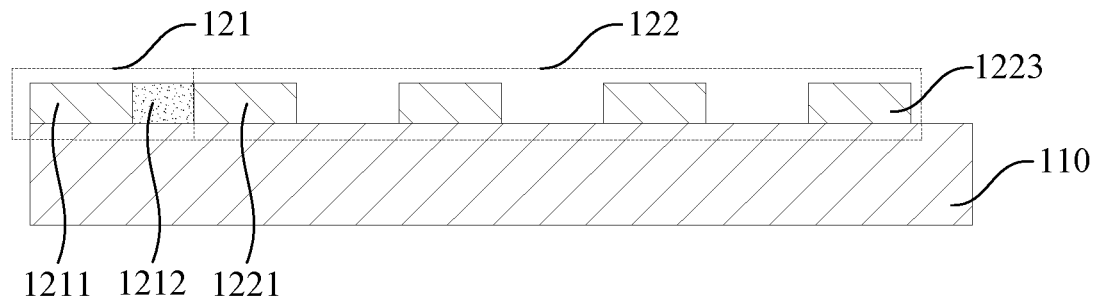
FIG. 5 is a schematic structural view of step S400 in FIG. 1 according to one embodiment of the present application.

As shown in FIG. 5 and FIG. 6, after the patterning process of the conductive layer 120 is completed, the photoresist layer 200 covering the conductive layer 120 needs to be removed to facilitate subsequent production of layers on the conductive layer 120. In other words, the photoresist layer 200 of the present application is only used for patterning the conductive layer 120.

S500: forming an electroplating layer 130 on the conductive layer 120 at a position corresponding to the electroplating area 122.

Figure 7:
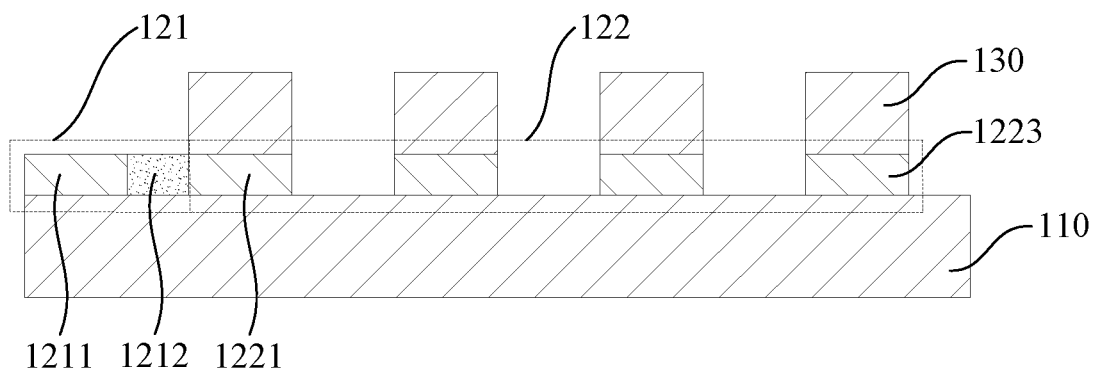
FIG. 7 is a schematic structural view of step S500 in FIG. 1 according to one embodiment of the present application.

As shown in FIG. 7, after removing the photoresist layer 200, the electroplating layer 130 needs to be formed on the conductive layer 120 to complete metal layer production in the array substrate 100. The electroplating area 122 in the conductive layer 120 is a functional area of the array substrate 100, and the conductive area 121 is only used to connect the electroplating area 122 to external circuits so that the electroplating process is performed normally. As a result, in forming the electroplating layer 130, it is only necessary to ensure that the electroplating layer 130 is formed on the conductive layer 120 at the position corresponding to the electroplating area 122. Such configuration ensures normal operations of the array substrate 100, and the electroplating layer 130 is formed without an unnecessary portion, thus reducing production costs of the array substrate 100.

Specifically, the step of forming the electroplating layer 130 on the conductive layer 120 at the position corresponding to the electroplating area 122 mainly includes following steps:

First, an electrolytic cell is provided, which includes an anode, a cathode, and an electrolyte electrically connected between the anode and the cathode. Then, the trace portions 1221 and the seed portions 1223 of the conductive layer 120 are placed in the electrolyte of the electrolytic cell, and the conductive electrode 1211 of the conductive layer 120 is electrically connected to the cathode of the electrolytic cell. After that, a preset current is applied between the anode and the cathode of the electrolytic cell, so that the electroplating layer 130 is formed on the trace portions 1221 and the seed portions 1223.

The electrolyte is a mixed solution containing electroplating ions, and a type of the electroplating ions is directly related to a material of the conductive layer 120. If the material of the conductive layer 120 in the present embodiment is copper, the electrolyte is a mixed solution containing copper ions. During the electroplating process, the electroplating ions move from the anode to the cathode of the electrolytic cell and deposit at the cathode to form the electroplating layer 130.

In the present application, the trace portions 1221 and the seed portions 1223 are placed in the electrolyte of the electrolytic cell, the conductive electrode 1211 is electrically connected to the cathode of the electrolytic cell, and the anode of the electrolytic cell is also electrically connected to the electrolyte, thereby forming a conductive circuit loop. Since an area where the trace portions 1221 and the seed portions 1223 are located is a main functional area of the array substrate 100, during the electroplating process, only the trace portions 1221 and the seed portions 1223 are required to be placed in the electrolyte, so the electroplating layer 130 is only formed on the trace portions 1221 and the seed portions 1223. Accordingly, maximum utilization of the electroplating layer 130 is realized, and the production costs are increased because the electroplating layer 130 are not formed in other unnecessary areas.

In some embodiments, the connection portion 1212 is connected between the conductive electrode 1211 and the trace portion 1221, therefore even though the connection portion 1212 only serves as a conductive channel between the conductive electrode 1211 and the trace portion 1221, the connection portion 1212 can be partially placed in the electrolyte during electroplating to ensure that the trace portion 1221 and the seed portion 1223 can be completely immersed in the electrolyte. Accordingly, it can be ensured that surfaces of the trace portions 1221 and the seed portions 1223 can form the electroplating layer 130 with uniformity and stability.

The extent that the connection portions 1212 are immersed in the electrolyte can be adjusted according to actual conditions, as long as the electroplating layer 130 can be formed stably on the surfaces of the trace portions 1221 and the seed portions 1223, and the present application is not limited in this regard.

It should be noted that a thickness and the uniformity of the electroplating layer 130 are directly related to a concentration of the electroplating ions in the electrolyte, an electroplating time, and an electroplating current. If the electroplating layer 130 needs to be thicker, the concentration of the electroplating ions in the electrolyte and the electroplating time can be correspondingly increased. If the uniformity of the electroplating layer 130 needs to be ensured at the same time, the electroplating current can be decreased to lower a deposition speed of the electroplating ions depositing on the surfaces of the trace portions 1221 and the seed portions 1223 to ensure uniform deposition of the electroplating layer 130. The concentration of the electroplating ions, the electroplating time, and a magnitude of the electroplating current can be adjusted according to actual electroplating requirements, and the present application is not limited in this regard.

S600: disconnecting the electroplating area 122 from the conductive area 121.

Figure 8:
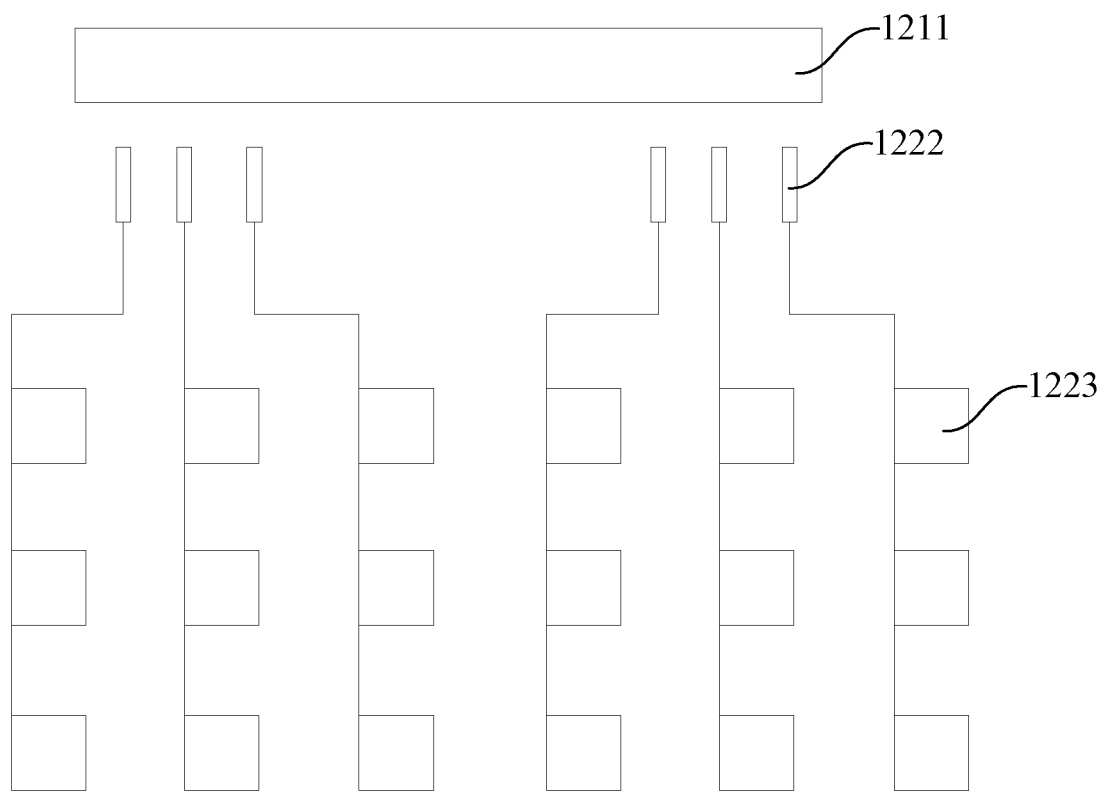
FIG. 8 is a top view illustrating step S600 in FIG. 1 according to one embodiment of the present application.

As shown in FIG. 8 and FIG. 9, after the production of the electroplating layer 130 is completed, the electroplating current between the anode and the cathode of the electrolytic cell is disconnected, the conductive electrode 1211 is disconnected from the cathode of the electrolytic cell, and the trace portions 1221 and the seed portions 1223 are removed from the electrolyte. At this point, since the electroplating area 122 and the conductive area 121 are still electrically connected to each other, it means that the entire conductive layer 120 is electrically connected. In that case, if the subsequent film layers are directly fabricated, during the use of the array substrate 100, ON and OFF states of the entire conductive layer 120 and the electroplating layer 130 are always the same, and hence it is unable to achieve individual control of a certain area on the array substrate 100. Therefore, it is necessary to disconnect the electroplating area 122 from the conductive area 121, and adjust the connection configuration of the trace portions 1221 and the seed portions 1223 in the electroplating area 122 to achieve different control requirements of the array substrate 100.

Optionally, when to disconnect the electroplating area 122 from the conductive area 121, the connection portion 1212 can be removed or disconnected by means of a laser beam, so that the conductive electrode 1211 is disconnected from the trace portion 1221, and thereby the electroplating area 122 is disconnected from the conductive area 121. This step further explains that the connection portion 1212 is only used as a conductive channel between the conductive electrode 1211 and the trace portion 1221.

If the conductive electrode 1211 and the trace portion 1221 are directly connected without having the connection portion 1212 disposed therebetween 1221, the conductive electrode 1211 needs to be partially removed in order to disconnect the electroplating area 122 from the conductive area 121. However, an area of the conductive electrode 1211 to be removed is larger than an area of the connection portion 1212, resulting in increased energy consumption. Alternatively, the trace portion 1221 is partially removed in order to disconnect the electroplating area 122 from the conductive area 121. However, this causes damages to the structure of the electroplating layer 130 and even affects the overall performance of the array substrate 100 because the electroplating layer 130 is formed on the trace portion 1221. Therefore, by having the connection portion 1212, the present application can reduce production energy consumption and ensure the structural stability of the electroplating layer 130.

It should be noted that, during electroplating, a portion of the connection portion 1212 can be placed in the electrolyte, and a surface of this portion also forms the electroplating layer 130, while a portion of the connection portion 1212 outside the electrolyte does not form the electroplating layer 130. When the electroplating area 122 is disconnected from the conductive area 121, a laser beam can be used to remove the portion of the connection portion 1212 where the electroplating layer 130 is not formed, so as to further reduce the production energy consumption of the array substrate 100 and save the production costs.

Optionally, when the laser beam is used to remove the connection portions 1212, the trace portions 1221 and the electroplating layer 130 on the trace portions 1221 can be patterned at the same time to form the conductive lines 1222, so that the conductive lines 1222 and the seed portions 1223 are electrically connected. The conductive lines 1222 are formed by patterning the trace portions 1221, which facilitates a wiring design and electrical connection between the array substrate 100 and other functional layers.

In some embodiments, the conductive layer 120 includes multiple seed portions 1223 and multiple conductive lines 1222. The seed portions 1223 are distributed in an array. That is, the seed portions 1223 are distributed in multiple rows and columns. Each conductive line 1222 is electrically connected to the seed portions 1223 of each column. That is to say, the seed portions 1223 of each column are in an on state or an off state at the same time during operations of the array substrate 100, which facilitates synchronous control of the seed portions 1223 of a same column and the electroplating layer 130 on the seed portions 1223 of the same column in the array substrate, thus simplifying a control method of the array substrate 100.

It should be noted that the array substrate 100 includes a thin film transistor layer. The thin film transistor layer includes a plurality of metal layers, and each metal layer can be produced by the above manufacturing method according to requirements. In the present application, the seed portions 1223 and the electroplating layer 130 on the seed portions 1223 form one or more of a gate, a gate line, a source-drain, or a data line. The thin film transistor layer of different structures can be obtained according to designed positions of the gate and the source-drain.

The gate and the gate line are located in the same film layer, and the source-drain and the data line are located in the same film layer. This structural design is convenient for a wiring design between the gate line and the data line, and prevents mutual crosstalk or short circuit which may cause failures of the array substrate 100.

Optionally, in the present application, a thickness of the photoresist layer 200 is greater than or equal to 1 micrometer and less than or equal to 1.5 micrometers. If the thickness of the photoresist layer 200 is too thin, the patterned photoresist layer 200 cannot effectively function as a mask, thereby affecting the patterning process of the conductive layer 120. If the thickness of the photoresist layer 200 is too thick, the photoresist layer 200 has an excessive amount of material, and energy consumption during patterning of the photoresist layer 200 is also relatively high, resulting in relatively high production costs.

In an actual production process, the thickness of the photoresist layer 200 can be set to 1 micrometer, 1.2 micrometers, 1.4 micrometers, or 1.5 micrometers, which not only ensures that the photoresist layer 200 can be used as the mask for the patterning process of the conductive layer 120, but also prevents the photoresist layer 200 from being overly thick to result in high production costs and energy consumption. A specific value of the thickness of the photoresist layer 200 can be adjusted according to actual design requirements, and the present application is not limited in this regard.

The manufacturing method of the array substrate 100 in the embodiment of the present application includes providing a base substrate 110; sequentially forming a conductive layer 120 and a photoresist layer 200 on the base substrate 110; patterning the photoresist layer 200 and the conductive layer 120, wherein after patterned, the conductive layer 120 includes the electroplating area 122 and the conductive area 121 which are electrically connected; removing the photoresist layer 200; forming an electroplating layer 130 on the conductive layer 120 at a position corresponding to the electroplating area 122; and disconnecting the electroplating layer 130 from the conductive layer 120. The photoresist layer 200 on the conductive layer 120 is removed before the step of forming the electroplating layer 130, so the photoresist layer 200 is only used for patterning the conductive layer 120. As a result, the photoresist layer 200 has a thinner thickness and requires less material, thus reducing the production costs and the energy consumption for producing the array substrate 100.

Further, the present application provides an array substrate. The array substrate can be produced by the above-mentioned manufacturing method. Since the array substrate adopts all the technical solutions of all the above-mentioned embodiments, the array substrate has at least all the advantages of the technical solutions of the above-mentioned embodiments, and a detailed description thereof is not repeated here.

FIG. 9 is a schematic structural view of an array substrate according to one embodiment of the present application. As shown in FIG. 9, the array substrate 100 includes a base substrate 110, which serves as a support structure for the array substrate 100 and is used to support other functional film layers in the array substrate 100 to ensure the overall structural stability of the array substrate 100. A material of the base substrate 110 can be a glass substrate or other types of materials.

The array substrate 100 includes a conductive layer 120 disposed on the base substrate 110. The conductive layer 120 includes a conductive area 121 and an electroplating area 122 both in a patterned form. The conductive area 121 and the electroplating area 122 are spaced apart. The conductive area 121 mainly functions to conduct electricity to connect the electroplating area 122 to external circuits during fabrication of the array substrate 100. The electroplating area 122 serves to form an electroplating structure for forming a target film layer. After the array substrate 100 is fabricated, the conductive area 121 and the electroplating area 122 are spaced apart, so as to facilitate individual control of a certain area on the array substrate 100 and meet different control requirements of the array substrate 100.

The array substrate 100 includes an electroplating layer 130. The electroplating layer 130 is disposed on the conductive layer 120 at a position corresponding to the electroplating region 122, and the electroplating layer 130 and the conductive layer 120 together form a target film layer. The array substrate 100 includes a thin film transistor layer, the thin film transistor layer includes multiple metal layers, and the electroplating layer 130 and the conductive layer 120 at the position corresponding to the electroplating area 122 together form a metal layer.

Optionally, the conductive area 121 includes a conductive electrode 1211. The electroplating area 122 includes a plurality of trace portions 1221 and a plurality of seed portions 1223. The trace portions 1221 are electrically connected to the seed portions 1223, and the electroplating layer 130 is disposed on the trace portions 1221 and the seed portions 1223.

As shown in FIG. 8, in a process of producing the array substrate 100, the conductive electrode 1211 is used to connect to external circuits, so as to facilitate an electroplating process in the electroplating area 122. The electroplating area 122 serves as a main functional area of the array substrate 100 and is used to form the target film layer. By electrically connecting the trace portion 1221 to the seed portion 1223, a circuit inside the electroplating area 122 is electrically connected to facilitate fabrication of the target film layer of the electroplating area 122 and facilitate circuit control during operations of the array substrate 100.

Optionally, the electroplating area 122 includes multiple trace portions 1221 and multiple seed portions 1223. Each trace portion 1221 is electrically connected to multiple seed portions 1223. One trace portion 1221 is electrically connected to multiple seed portions 1223, so that the multiple seed portions 1223 can be synchronously controlled by one trace portion 1221 during operations of the array substrate 100, so as to simplify whole circuit control of the array substrate 100.

In the present application, the seed portions 1223 and the electroplating layer 130 on the seed portions 1223 form one or more of a gate, a gate line, a source-drain, or a data line. The thin film transistor layer of different structures can be obtained according to designed positions of the gate and the source-drain.

It should be noted that the thin film transistor layer includes a plurality of thin film transistors, the thin film transistors are distributed in an array, and each thin film transistor includes a gate and a source-drain. That is to say, each thin film transistor includes the seed portion 1223, so the conductive layer 120 includes multiple seed portions 1223, and the seed portions 1223 are distributed in an array to form thin film transistors distributed in an array.

The trace portions 1221 and the electroplating layer 130 on the trace portions 1221 can form a plurality of conductive lines 1222. Each conductive line 1222 can be electrically connected to a column of the seed portions 1223. That is to say, each conductive line 1222 is electrically connected to a column of the thin film transistors, so as to realize synchronous control of the column of the thin film transistors, which simplifies circuit control of the array substrate 100.

Optionally, the conductive electrodes 1211 are strip-shaped. The trace portions 1221 are arranged side by side along the extending direction of the conductive electrode 1211. Since each trace portion 1221 is electrically connected to multiple seed portions 1223 at the same time, this structural design is beneficial to a parallel arrangement between the seed portions 1223 connected to different trace portions 1221, so as to avoid mutual crosstalk and prevent normal operations of the array substrate 100.

It should be noted that the conductive electrode 1211 is located at an edge of the base substrate 110. That is to say, multiple trace portions 1221 are arranged in parallel on a same side of the conductive electrode 1211. This structural design enables the conductive electrode 1211 not to affect the electrical connection between other functional film layers and the trace portions 1221 during the use of the array substrate 100, which helps to optimize a circuit design in the array substrate 100.

Optionally, in the present application, a thickness of the conductive layer 120 is greater than or equal to 0.5 micrometer and less than or equal to 0.6 micrometer. If the thickness of the conductive layer 120 is too thin, resistance of the conductive layer 120 is too high, thereby affecting an electroplating process, which is not conducive to stable formation of the electroplating layer 130. If the thickness of the conductive layer 120 is too thick, too much energy is consumed to pattern the conductive layer 120, thereby increasing the production costs.

In an actual manufacturing process, the thickness of the conductive layer 120 can be set to 0.5 micrometer, 0.52 micrometer, 0.55 micrometer, 0.58 micrometer, or 0.6 micrometer, which not only ensures the stable formation of the electroplating layer 130, but also avoids having high power consumption in the patterning process of the conductive layer 120. A specific value of the thickness of the conductive layer 120 can be adjusted according to actual design requirements, and the present application is not limited in this regard.

Optionally, a thickness of the electroplating layer 130 in the present application is greater than or equal to 6 micrometers. If the thickness of the electroplating layer 130 is too thin, resistance of the metal layer in the final array substrate 100 is too high, so that internal resistance of the metal layer itself is too high, and a voltage drop caused by the internal resistance is greater, which affects overall performance of the array substrate 100.

In the actual manufacturing process, the thickness of the electroplating layer 130 can be set to 6 micrometers, 8 micrometers, 10 micrometers, or 12 micrometers, thus ensuring that the internal resistance of the electroplating layer 130 is low and ensuring the stable use of the array substrate 100. A specific value of the thickness of the electroplating layer 130 can be adjusted according to actual design requirements, and the present application is not limited in this regard.

It should be noted that a material of the conductive layer 120 in the present application is the same as a material of the electroplating layer 130. The electroplating layer 130 is formed by depositing electroplating ions in an electrolyte on the conductive layer 120. That is to say, a type of the electroplating ions is the same as the material of the conductive layer 120. By using the same type of material for the electroplating ions and the conductive layer 120, on the one hand, the present application avoids a large difference in activity between the conductive layer 120 and the electroplating layer 130, and thus prevents affecting the stability between the electroplating layer 130 and the conductive layer 120. On the other hand, it is beneficial to improve connection strength between the electroplating layer 130 and the conductive layer 120, and avoid peeling between the electroplating layer 130 and the conductive layer 120 during the fabrication or use of the array substrate 100, which affects the structural stability of the array substrate 100.

Finally, the present application also provides a display panel, which includes an array substrate. A specific structure of the array substrate refers to the above-mentioned embodiments. Since the present display panel adopts all the technical solutions of all the above-mentioned embodiments, the display panel has at least the above advantages brought by the technical solutions of the embodiments, and a detailed description thereof is not repeated herein.

Figure 10:
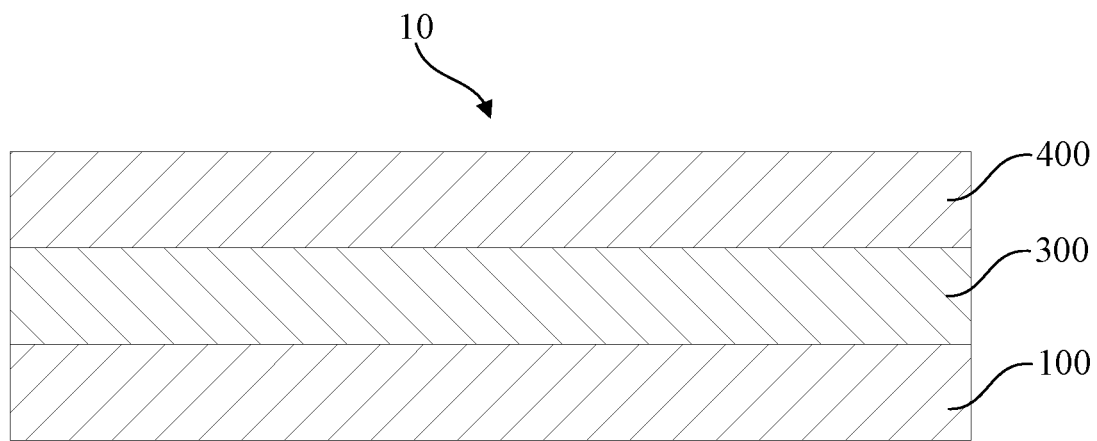
FIG. 10 is a schematic structural view of a display panel according to one embodiment of the present application.

FIG. 10 is a schematic structural view of the display panel according to one embodiment of the present application. As shown in FIG. 10, the display panel 10 includes an array substrate 100, a light-emitting device 300, and an encapsulating assembly 400. The light-emitting device 300 is disposed on the array substrate 100. The encapsulating assembly 400 is disposed on the light-emitting device 300.

The light-emitting device 300 includes light-emitting pixels. The light-emitting pixels are distributed in an array. Each light-emitting pixel is electrically connected to a corresponding thin film transistor in the array substrate 100. Light-emitting conditions of the light-emitting pixels can be controlled by turning on and off the thin film transistors. Since the seed portions 1223 in each column of the thin film transistors are electrically connected together, the light-emitting conditions of the light-emitting pixels in the same column can be controlled at the same time when the light-emitting conditions of the light-emitting device 300 are controlled, thus simplifying circuit control in the display panel 10.

The encapsulating assembly 400 includes a multi-layered encapsulating layer for protecting the light-emitting pixels in the light-emitting device 300 and the thin-film transistors in the array substrate 100 to prevent moisture or oxygen in the air from entering the interior of the display panel 10 and corroding related functional film layers to cause the display panel 10 to fail.

It should be noted that the display panel 10 in the present application has a wide range of applications, including various display devices for display and lighting, such as televisions, computers, mobile phones, foldable and rollable display screens, and wearable devices like smart bracelets and smart watches. All of them fall within the scope of application of the display panel 10 of the present application.

The present application provides a manufacturing method of an array substrate, an array substrate, and a display panel have been described above in detail. The working principles and embodiments of the present application are described with specific embodiments. The descriptions of the above embodiments are only for ease of understanding the method and the main ideas of the present application. Those skilled in the art can change the specific embodiments and application scope according to the idea of the present application. In summary, the content of the present specification should not be construed as a limitation to the present application.

What is claimed is:

1. A manufacturing method of an array substrate, wherein the manufacturing method comprises following steps:
providing a base substrate;
sequentially forming a conductive layer and a photoresist layer on the base substrate;
patterning the photoresist layer and the conductive layer, wherein the patterned conductive layer comprises a conductive area and an electroplating area which are electrically connected;
removing the photoresist layer;
forming an electroplating layer on the conductive layer at a position corresponding to the electroplating area; and
disconnecting the electroplating area from the conductive area.

2. The manufacturing method of the array substrate according to claim 1, wherein the step of patterning the photoresist layer and the conductive layer comprises:

patterning the photoresist layer to expose a portion of the conductive layer; and patterning the conductive layer and removing the exposed portion of the conductive layer to form a conductive electrode, a plurality of connection portions, a plurality of trace portions, and a plurality of seed portions, wherein the conductive electrode and the connection portions form a conductive area, the trace portions and the seed portions form an electroplating area, each trace portion is electrically connected to the seed portions, and the connection portions are connected between the conductive electrode and the trace portions, so that the electroplating area and the conductive area are electrically connected to each other.

3. The manufacturing method of the array substrate according to claim 2, wherein the conductive layer comprises multiple trace portions and multiple connection portions, and the connection portions and the trace portions are connected in a one-to-one correspondence.

4. The manufacturing method of the array substrate according to claim 3, wherein the conductive electrode is strip-shaped, the trace portions are arranged side by side along an extending direction of the conductive electrode, and each connection portion is connected between the conductive electrode and one of the trace portions.

5. The manufacturing method of the array substrate according to claim 4, wherein along the extending direction of the conductive electrode, a width of each connection portion is less than a width of the correspondingly connected trace portion.

6. The manufacturing method of the array substrate according to claim 2, wherein the step of forming the electroplating layer on the conductive layer at a position corresponding to the electroplating area comprises:

providing an electrolytic cell, wherein the electrolytic cell comprises an anode, a cathode, and an electrolyte electrically connected between the anode and the cathode;

placing the trace portions and the seed portions in the electrolyte of the electrolytic cell;

electrically connecting the conductive electrode to the cathode of the electrolytic cell; and applying a preset current between the anode and the cathode of the electrolytic cell, so that the electroplating layer is formed on the trace portions and the seed portions.

7. The manufacturing method of the array substrate according to claim 2, wherein the step of disconnecting the electroplating area from the conductive area comprises:

removing and cutting off the connection portions, so that the conductive electrode is disconnected from the trace portions, and the electroplating area is disconnected from the conductive area.

8. The manufacturing method of the array substrate according to claim 2, wherein the manufacturing method further comprises following steps:

patterning the trace portions and the electroplating layer on the trace portions to form a plurality of conductive lines, so that the conductive lines are electrically connected to the seed portions.

9. The manufacturing method of the array substrate according to claim 1, wherein a thickness of the photoresist layer is greater than or equal to 1 micrometer and less than or equal to 1.5 micrometers.

10. An array substrate, comprising:

a base substrate;

a conductive layer disposed on the base substrate, wherein the conductive layer comprises a conductive area and an electroplating area both in a patterned form, and the conductive area and the electroplating area are spaced apart; and an electroplating layer disposed on the conductive layer at a position corresponding to the electroplating area, wherein the conductive area comprises a conductive electrode, the electroplating area comprises a plurality of trace portions and a plurality of seed portions, the trace portions are electrically connected to the seed portions, and the electroplating layer is disposed on the trace portions and the seed portions.

11. The array substrate according to claim 10, wherein the electroplating area comprises multiple trace portions and multiple seed portions, and each of the trace portions is electrically connected to the seed portions.

12. The array substrate according to claim 11, wherein the seed portions and the electroplating layer on the seed portions form one or more of a gate, a gate line, a source-drain, or a data line.

13. The array substrate according to claim 11, wherein the trace portions and the electroplating layer on the trace portions constitute a plurality of conductive lines, and the conductive lines are electrically connected to the seed portions.

14. The array substrate according to claim 13, wherein the seed portions are distributed in an array, and each of the conductive lines is electrically connected to each column of the seed portions.

15. The array substrate according to claim 11, wherein the conductive electrode is strip-shaped, and the trace portions are arranged side by side along an extending direction of the conductive electrode.

16. The array substrate according to claim 15, wherein the conductive electrode is disposed at an edge of the base substrate, and the trace portions are arranged side by side on a same side of the conductive electrode.

17. The array substrate according to claim 10, wherein a thickness of the conductive layer is greater than or equal to 0.5 micrometer and less than or equal to 0.6 micrometer; and a thickness of the electroplating layer is greater than or equal to 6 micrometers.

18. The array substrate according to claim 10, wherein a material of the conductive layer is same as a material of the electroplating layer.

19. A display panel, comprising:

the array substrate of claim 10;

a light-emitting device disposed on the array substrate;

an encapsulating assembly disposed on the light-emitting device.

20. An array substrate, comprising:

a base substrate;

a conductive layer disposed on the base substrate, wherein the conductive layer comprises a conductive area and an electroplating area both in a patterned form, and the conductive area and the electroplating area are spaced apart; and an electroplating layer disposed on the conductive layer at a position corresponding to the electroplating area, wherein the conductive area comprises a conductive electrode, the electroplating area comprises multiple trace portions and multiple seed portions, and each of the trace portions is electrically connected to the seed portions, and the electroplating layer is disposed on the trace portions and the seed portions.

* * * * *